(12) United States Patent
Kwon et al.

(10) Patent No.: US 8,398,874 B2
(45) Date of Patent: Mar. 19, 2013

(54) METHODS OF MANUFACTURING SEMICONDUCTORS USING DUMMY PATTERNS

(75) Inventors: Byoung-Ho Kwon, Hwaseong-si (KR); Bo-Un Yoon, Seoul (KR); Min-Sang Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 195 days.

(21) Appl. No.: 12/953,686

(22) Filed: Nov. 24, 2010

(65) Prior Publication Data

US 2011/0124194 A1 May 26, 2011

(30) Foreign Application Priority Data

Nov. 24, 2009 (KR) .................. 10-2009-0114063

(51) Int. Cl.
*B44C 1/22* (2006.01)
*H01L 21/302* (2006.01)
(52) U.S. Cl. ............... 216/41; 216/88; 438/692; 430/5
(58) Field of Classification Search ............. 216/41, 216/88; 438/692; 430/5
See application file for complete search history.

(56) References Cited

U.S. PATENT DOCUMENTS

| 2004/0063038 A1* | 4/2004 | Shin et al. ............ 430/311 |
| 2005/0158935 A1* | 7/2005 | Shin et al. ............ 438/197 |
| 2006/0190920 A1* | 8/2006 | Sakurai et al. .......... 716/21 |
| 2009/0087959 A1* | 4/2009 | Ban .................... 438/401 |
| 2010/0184287 A1* | 7/2010 | Eom ................... 438/669 |

FOREIGN PATENT DOCUMENTS

| KR | 10-2007-0115330 A | 12/2007 |
| KR | 100899397 B1 | 5/2009 |
| KR | 10-2009-0065148 A | 6/2009 |

* cited by examiner

*Primary Examiner* — Shamim Ahmed
(74) *Attorney, Agent, or Firm* — Myers Bigel Sibley & Sajovec, P.A.

(57) ABSTRACT

A method of manufacturing a semiconductor device is provided. A pattern layer is formed on a substrate defined to include a main pattern region and a dummy pattern region. A preliminary main pattern and a preliminary dummy pattern may be formed by patterning the pattern layer so that an upper surface area of the preliminary dummy pattern facing away from a surface of the substrate is less than an entire area of the dummy pattern region that is be subjected to subsequent planarization. The preliminary main pattern and the preliminary dummy pattern are partially etched to form a main pattern and a dummy pattern.

16 Claims, 15 Drawing Sheets

METHODS OF MANUFACTURING SEMICONDUCTORS USING DUMMY PATTERNS

CLAIM OF PRIORITY

This application claims priority under 35 USC §119 to Korean Patent Application No. 2009-0114063, filed on Dec. 24, 2009 in the Korean Intellectual Property Office (KIPO), the contents of which are herein incorporated by reference in their entirety.

BACKGROUND

1. Field

Example embodiments relate to semiconductor devices and methods of manufacturing the same. More particularly, example embodiments relate to semiconductor devices having a minute critical dimension and methods of manufacturing the same.

2. Description of the Related Art

Generally, forming patterns that are narrower than 40 nm may be difficult in view of limitations of some photolithography processes. In order to form these types of patterns, double patterning may be used. Double patterning can utilize a side wall spacer as an etching mask. For example, a side wall spacer is formed on a side wall of an existing pattern formed using a photolithography process. The existing pattern can be removed leaving the side wall spacers in place. The remaining side wall spacers can then be used to etch an underlying layer.

Accordingly, double patterning may be complicated because several etching processes are used.

SUMMARY

In some embodiments according to the inventive concept, a method of manufacturing a semiconductor device includes forming a pattern layer on a substrate defined to include a main pattern region and a dummy pattern region, forming a preliminary main pattern and a preliminary dummy pattern by patterning the pattern layer so that an upper surface area of the preliminary dummy pattern facing away from a surface of the substrate is less than an entire area of the dummy pattern region that is be subjected to subsequent planarization, and partially etching the preliminary main pattern and the preliminary dummy pattern to form a main pattern and a dummy pattern.

In some embodiments according to the inventive concept, forming a preliminary main pattern and a preliminary dummy pattern includes forming the preliminary main pattern and the preliminary dummy pattern by patterning the pattern layer so that the upper surface area of the preliminary dummy pattern facing away from the surface of the substrate is less than the entire area of the dummy pattern region that is to be subjected to subsequent planarization and is about equal to or greater than 30% of the entire area of the dummy pattern region that is to be subjected to subsequent planarization.

In some embodiments according to the inventive concept, the method can also include forming the preliminary main pattern and the preliminary dummy pattern by patterning the pattern layer so that the upper surface area of the preliminary dummy pattern facing away from the surface of the substrate is about equal to or less than 85% of the entire area of the dummy pattern region that is to be subjected to subsequent planarization.

In some embodiments according to the inventive concept, forming a preliminary main pattern and a preliminary dummy pattern includes forming the preliminary main pattern and the preliminary dummy pattern by patterning the pattern layer so that the upper surface area of the preliminary dummy pattern facing away from the surface of the substrate is less than the entire area of the dummy pattern region that is to be subjected to subsequent planarization and is about equal to or greater than 45% of the entire area of the dummy pattern region that is to be subjected to subsequent planarization.

In some embodiments according to the inventive concept, forming the preliminary main pattern and the preliminary dummy pattern includes forming a sacrificial layer pattern on the pattern layer, forming a spacer on a side wall of the sacrificial layer pattern, removing the sacrificial layer pattern so that the spacer remains, and partially etching the pattern layer using the spacer as an etching mask to form a portion of the preliminary main pattern having a width that is less than a width of the sacrificial layer pattern having been removed.

In some embodiments according to the inventive concept, forming the preliminary main pattern and the preliminary dummy pattern includes forming a photoresist pattern on the pattern layer and partially etching the pattern layer using the photoresist pattern as an etching mask to form a remaining portion of the preliminary main pattern and the preliminary dummy pattern.

In some embodiments according to the inventive concept, partially etching the preliminary main pattern and the preliminary dummy pattern includes forming a photoresist pattern on the substrate, the photoresist pattern exposing portions of the preliminary main pattern and the preliminary dummy pattern and partially etching the preliminary main pattern and the preliminary dummy pattern using the photoresist pattern as an etching mask.

In some embodiments according to the inventive concept, the upper surface area is about equal to or greater than 45% of a total area of the dummy pattern region that is to be subjected to subsequent planarization. In some embodiments according to the inventive concept, the partially etching the preliminary dummy pattern includes etching a portion of the preliminary pattern having an area corresponding to about 15% of the total area of the dummy pattern region.

In some embodiments according to the inventive concept, forming the preliminary main pattern and the preliminary dummy pattern includes forming a plurality of the preliminary dummy patterns and partially etching the preliminary dummy pattern includes removing at least one of the plurality of the preliminary dummy patterns.

In some embodiments according to the inventive concept, partially etching the preliminary dummy pattern includes forming the dummy pattern having at least one hole therein. In some embodiments according to the inventive concept, partially etching the preliminary dummy pattern includes dividing the preliminary dummy pattern into a plurality of pieces.

In some embodiments according to the inventive concept, the method can include forming an insulating interlayer on the substrate to cover the main pattern and the dummy pattern and planarizing an upper portion of the insulating interlayer until a top surface of the main pattern and the upper surface of the dummy pattern are exposed.

In some embodiments according to the inventive concept, planarizing the upper portion of the insulating interlayer is performed by a chemical mechanical polishing (CMP) process. In some embodiments according to the inventive concept, planarizing the upper portion of the insulating interlayer is performed using the dummy pattern as a polish stop layer.

In some embodiments according to the inventive concept, a method of manufacturing a semiconductor device includes forming a preliminary main pattern and a preliminary dummy pattern by patterning the pattern layer so that an upper surface area of the preliminary dummy pattern facing away from a surface of the substrate is selected based on a width features included in the preliminary main pattern to provide the upper surface area to be less than an entire area of the dummy pattern region that is be subjected to subsequent planarization.

In some embodiments according to the inventive concept, the upper surface area of the preliminary dummy pattern facing away from a surface of the substrate is equal to or greater than about 35% and less than or equal to about 85%. In some embodiments according to the inventive concept, a method of manufacturing a semiconductor device includes forming a pattern layer on a substrate that is divided into a main pattern region and a dummy pattern region, forming a preliminary main pattern and a preliminary dummy pattern by patterning the pattern layer, and partially etching the preliminary main pattern and the preliminary dummy pattern to form a main pattern and a dummy pattern.

BRIEF DESCRIPTION OF THE DRAWINGS

Example embodiments will be more clearly understood from the following detailed description taken in conjunction with the accompanying drawings. FIGS. 1 to 20 represent non-limiting, example embodiments according to the inventive concept as described herein.

FIGS. 2A to 7A are top views illustrating a method of manufacturing the semiconductor device in FIGS. 1A and 1B according to the inventive concept. FIGS. 2B to 7B are cross-sectional views of the semiconductor device in FIGS. 2A to 7A, respectively, along the line I-I' according to the inventive concept.

FIG. 11 is a top view illustrating a semiconductor device in accordance with other example embodiments according to the inventive concept.

FIG. 12 is a top view illustrating a method of manufacturing the semiconductor device in FIG. 11 according to the inventive concept.

FIG. 13 is a top view illustrating a semiconductor device in accordance with other example embodiments according to the inventive concept.

FIG. 14 is a top view illustrating a method of manufacturing the semiconductor device in FIG. 13.

FIG. 15 is a top view illustrating a semiconductor device in accordance with other example embodiments according to the inventive concept.

FIG. 16 is a top view illustrating a method of manufacturing the semiconductor device in FIG. 15 according to the inventive concept.

FIG. 17 is a top view illustrating a semiconductor device in accordance with other example embodiments according to the inventive concept.

FIG. 18 is a top view illustrating a method of manufacturing the semiconductor device in FIG. 17 according to the inventive concept.

FIG. 19 is a top view illustrating a semiconductor device in accordance with other example embodiments according to the inventive concept.

FIG. 20 is a top view illustrating a method of manufacturing the semiconductor device in FIG. 19 according to the inventive concept.

DETAILED DESCRIPTION OF THE EMBODIMENTS ACCORDING TO THE INVENTIVE CONCEPT

Figure 1A:
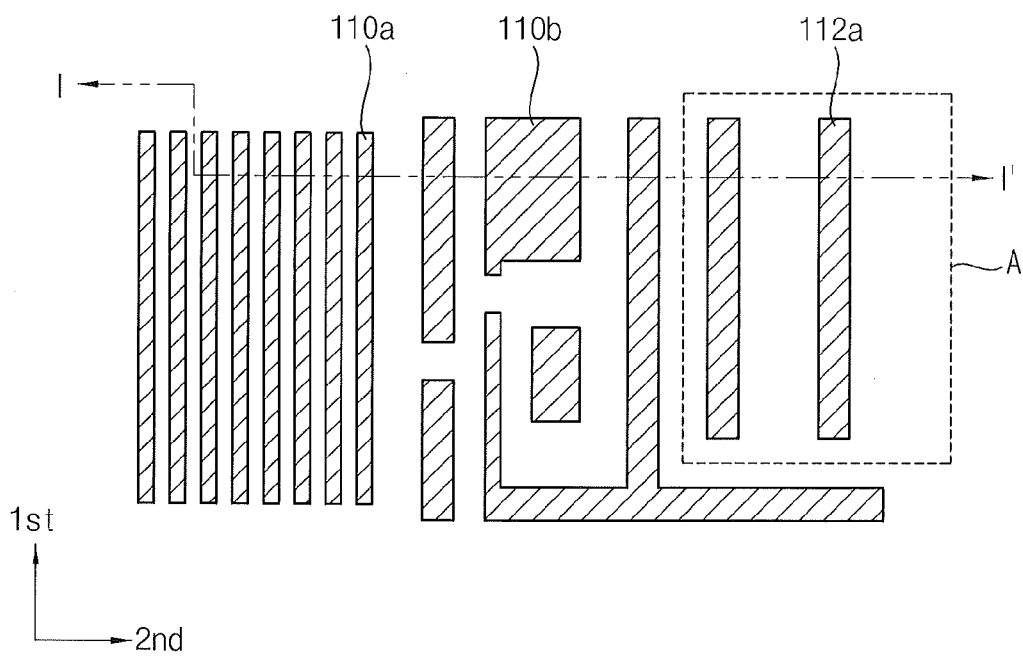
FIG. 1A is a top view illustrating a semiconductor device in accordance with example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 1B:
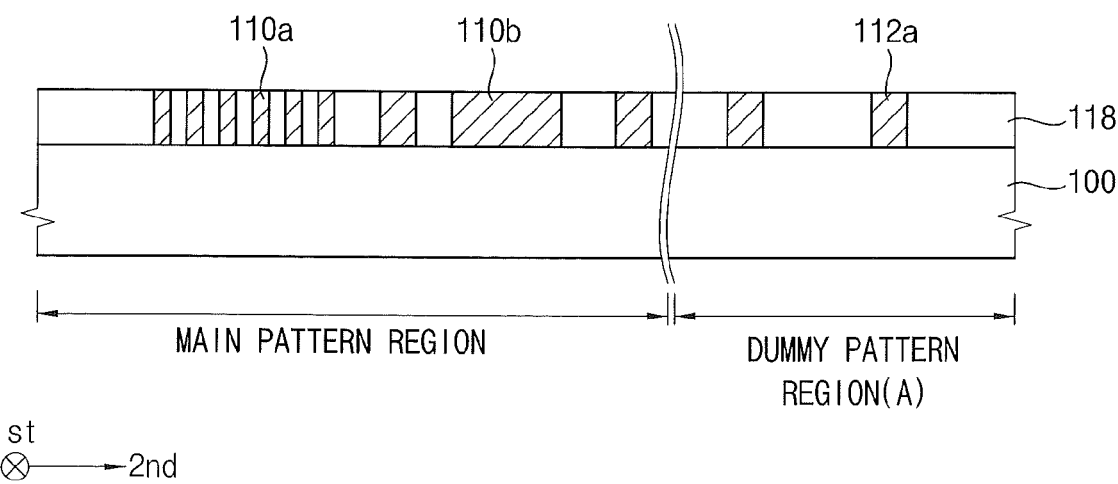
FIG. 1B is a cross-sectional view of the semiconductor device in FIG. 1A along the line I-I' according to the inventive concept.

FIG. 1A is a top view illustrating a semiconductor device in accordance with example embodiments. FIG. 1B is a cross-sectional view of the semiconductor device in FIG. 1A along the line I-I'.

Referring to FIGS. 1A and 1B, a substrate 100 includes a main pattern region and a dummy pattern region A. Patterns formed in the main pattern region may be main patterns 110a and 110b defining circuits used for operations of the semiconductor device. Dummy patterns 112a formed in the dummy pattern region A may be used as part of the formation of the main patterns 110a and 110b, but may neither define circuits nor be used for operations of the semiconductor device. In some embodiments according to the inventive concept, the dummy patterns 112a define inactive circuits which are not used for operations of the device.

The first and second main patterns 110a and 110b may include a conductive line, a pad electrode, a gate electrode, and the like. The first and second main patterns 110a and 110b may define circuits of the semiconductor device such as a memory device or a logic device.

The first and second main patterns 110a and 110b may have various line widths and various shapes according to designs of the circuits. In example embodiments according to the inventive concept, each of the first main patterns 110a may extend in a first direction and have a relatively small width in a second direction perpendicular to the first direction, and the second main patterns 110b may have a width in the second direction that is greater than that of the first main patterns 110a in the same direction.

The first main patterns 110a may be spaced apart from each other in the second direction, The first main patterns 110a may have a width less than a minimum line width of another pattern formed by a photolithography process. In example embodiments according to the inventive concept, the first main patterns 110a may have a width of less than about 40 nm. The second main patterns 110b may have a width about equal to or greater than the minimum line width of another pattern formed by a photolithography process. In example embodiments according to the inventive concept, the second main patterns 110b that are relatively wide may serve as a pad electrode that may provide a large contact area with other elements, e.g., a contact plug.

The dummy patterns 112a may be formed on the substrate 100 in the dummy pattern region A. The dummy pattern region A may include a first region in which the dummy patterns 112a are formed and a second region in which an insulating interlayer 118 is formed between the dummy patterns 112a. The dummy patterns 112a may have various shapes according to a shape of the dummy pattern region A, a layout and shapes of the main patterns 110a and 110b, etc.

In example embodiments according to the inventive concept, each of the dummy patterns 112a may be linear shaped and extend in the first direction, and the dummy patterns 112a may be spaced apart from each other in the second direction. In example embodiments according to the inventive concept, the dummy patterns 112a may have a width substantially the same as each other, and may be spaced apart from each other at a particular amount in the second direction.

In some embodiments according to the inventive concept, a total area of the dummy patterns 112a may be about 30% to 85% of a total area of the dummy pattern region A. For example, if the total area of the dummy patterns 112a is greater than about 30% of that of the dummy pattern region A, the dummy patterns 112a may provide a polish stop layer in a subsequent planarization process. Additionally, when preliminary dummy patterns (not shown) are patterned to form the dummy patterns 112a in an etching process for forming the main patterns 110a and 110b, an area of the preliminary dummy patterns corresponding to about 15% of the total area of the dummy pattern region A may be removed, so that an etching end point of the etching process for forming the main patterns 110a and 110b may be detected easily. Thus, the area of the dummy patterns 112a may be at most about 85% of the total area of the dummy pattern region A. In consideration of the function of the dummy patterns 112a, i.e., the polish stop layer and the etching end point, the area of the dummy patterns 112a may be, preferably, about 45 to about 85% of the total area of the dummy pattern region A.

The first and second main patterns 110a and 110b and the dummy patterns 112a may be substantially the same material.

The insulating interlayer 118 surrounding sidewalls of the first and second main patterns 110a and 110b and the dummy patterns 112a may be formed on the substrate 100. The first and second main patterns 110a and 110b, the dummy patterns 112a and the insulating interlayer 118 may have top surfaces coplanar with one another.

In some embodiments according to the inventive concept, the first and second main patterns 110a and 110b may have fewer defects because of the dummy patterns 112a.

FIGS. 2A to 7A are top views illustrating a method of manufacturing the semiconductor device in FIGS. 1A and 1B according to the inventive concept. FIGS. 2B to 7B are cross-sectional views of the semiconductor device in FIGS. 2A to 7A, respectively, along the line I-I' according to the inventive concept.

Figure 2A:
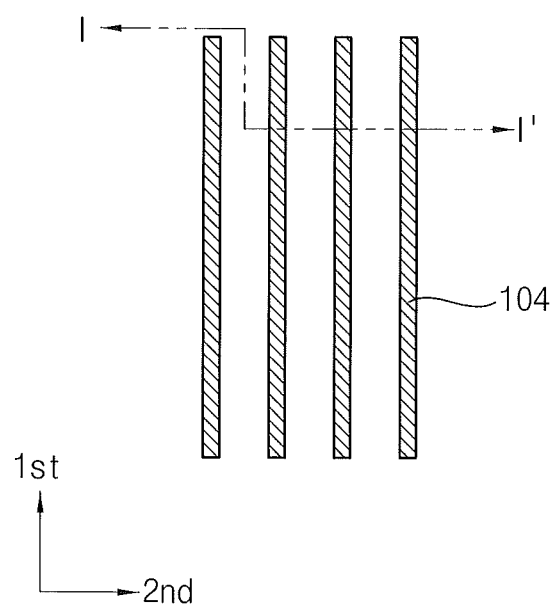
Figure 2B:
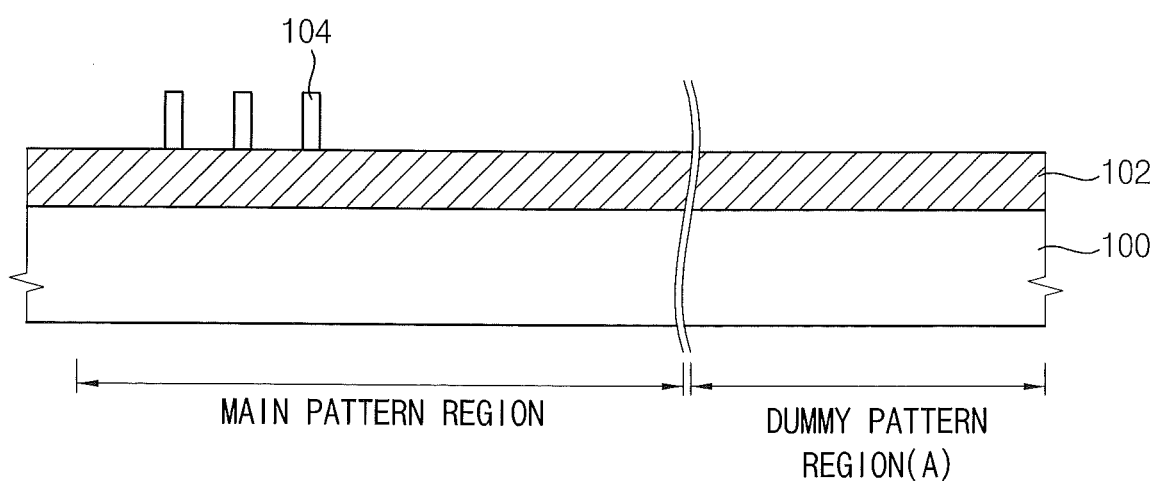

Referring to FIGS. 2A and 2B, a pattern layer 102 may be formed on the substrate 100 that may be defined to include a main pattern region and a dummy pattern region A.

A sacrificial layer may be formed on the pattern layer 102. The sacrificial layer may be formed using a material that may be removed easily by a wet etching process or an ashing process. The sacrificial layer may be a polymer. In example embodiments according to the inventive concept, the sacrificial layer may be a spin-on hardmask (SOH) such as a carbon-based spin-on hardmask (C—SOH) or a silicon-based spin-on hardmask (Si—SOH).

The sacrificial layer may be patterned to form a plurality of sacrificial layer patterns 104 spaced apart from each other in the second direction, each of which may extend in the first direction that is perpendicular to the second direction. In FIG. 2B, the sacrificial layer patterns 104 may be formed only in the main pattern region, however, the sacrificial layer patterns 104 may be formed in the dummy pattern region A also.

Figure 3A:
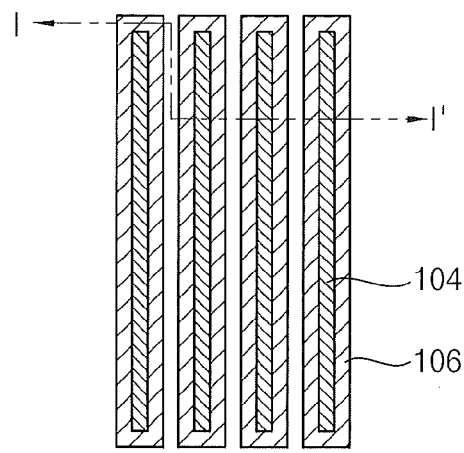
Figure 3B:
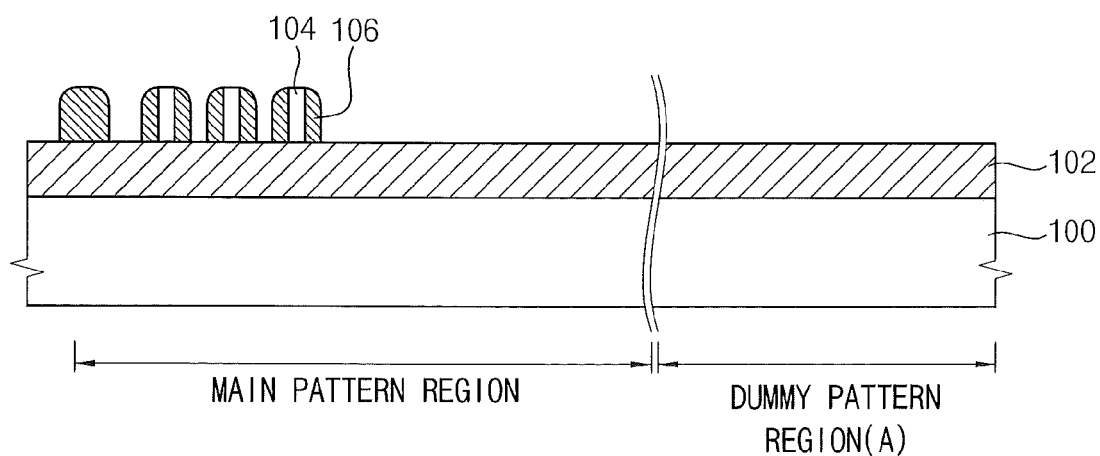

Referring to FIGS. 3A and 3B, a spacer layer may be formed on the pattern layer 102 to cover the sacrificial layer patterns 104. By performing an anisotropic etching process on the spacer layer, a remaining portion of the spacer layer can form spacers 106 on sidewalls of the sacrificial layer patterns 104. Particularly, each of the spacers 106 can include two opposing portions (one each of the opposing side walls) to define two lines extending in the first direction. The two lines can be joined together at respective end portions.

In FIG. 3A, the spacers 106 may be formed only on the sidewalls of the sacrificial layer patterns 104 in the main pattern region, however, when the sacrificial layer patterns 104 are formed also in the dummy pattern region A, the spacers 106 may be formed on sidewalls thereof in the dummy pattern region A also.

Figure 4A:
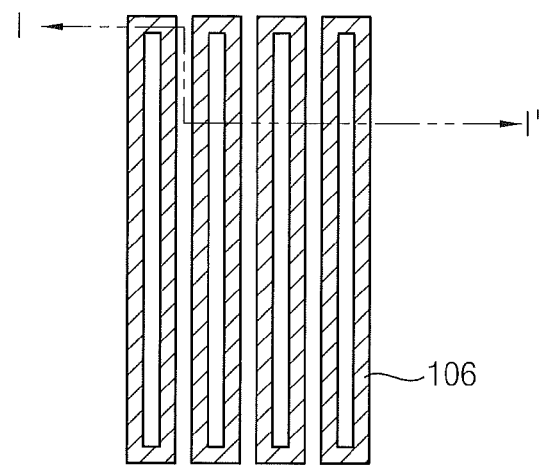
Figure 4B:
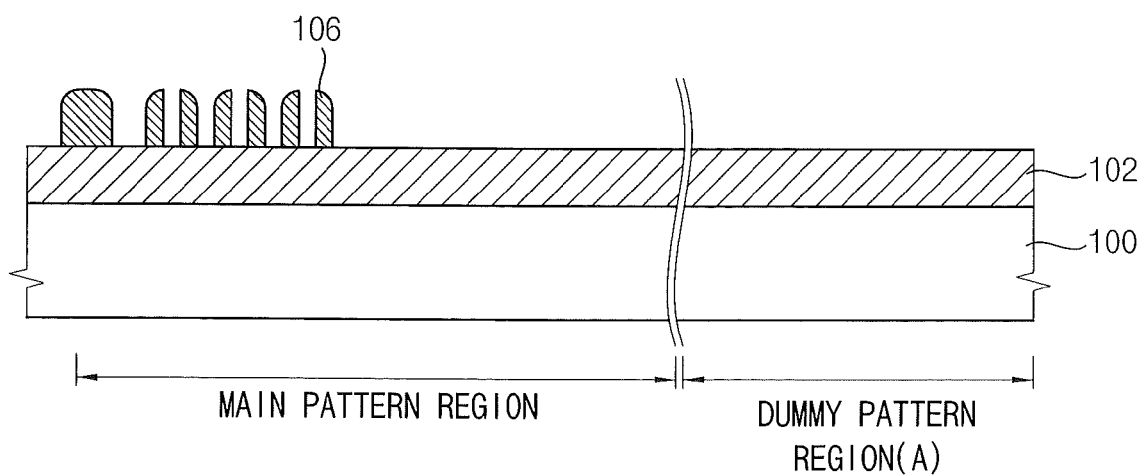

Referring to FIGS. 4A and 4B, the sacrificial layer patterns 104 may be removed. In example embodiments according to the inventive concept, the sacrificial layer patterns 104 may be removed by an ashing process and/or a stripping process. Thus, the spacers 106 may remain on the pattern layer 102 after removal of the sacrificial layer patterns 104.

Figure 5A:
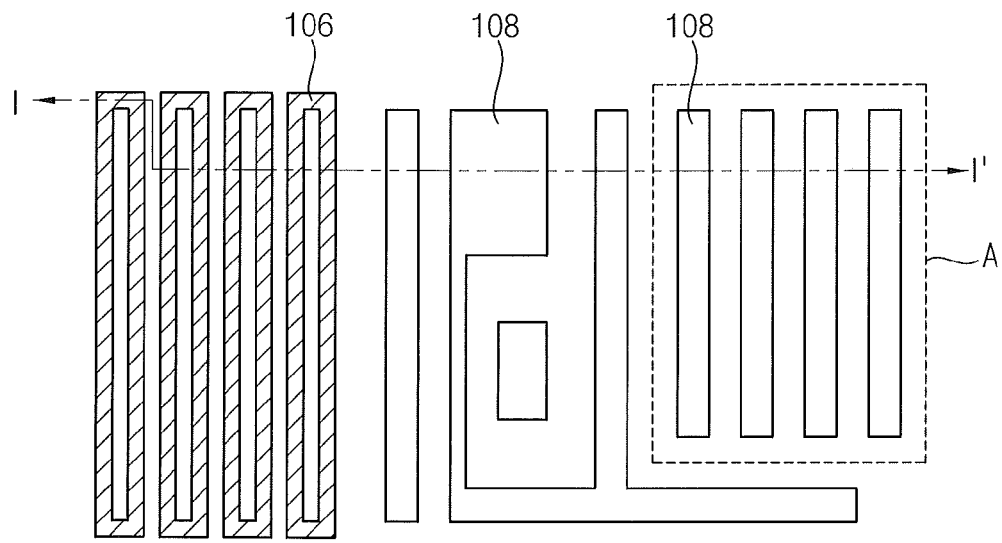
Figure 5B:
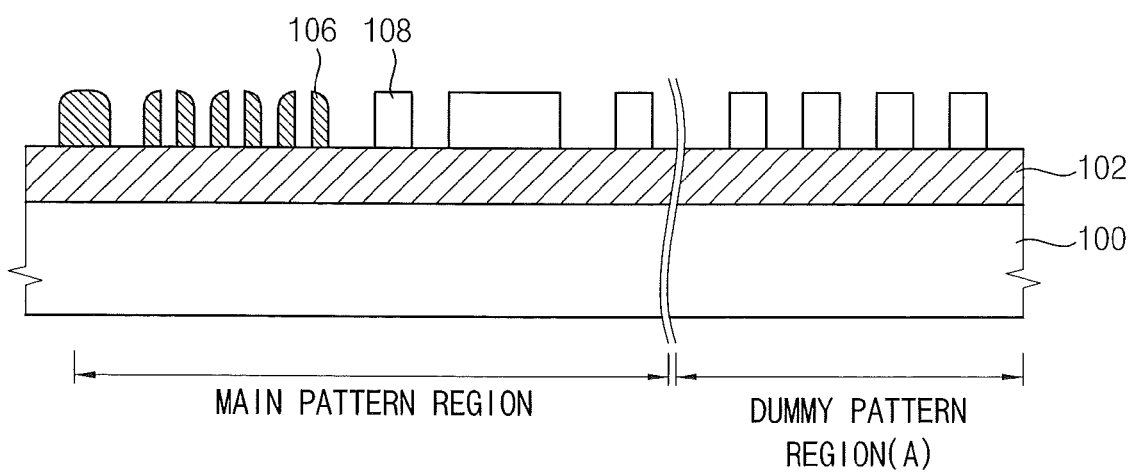

Referring to FIGS. 5A and 5B, a first photoresist film may be formed on the pattern layer 102. The first photoresist film may be patterned by a photolithography process to form first photoresist patterns 108. The first photoresist patterns 108 may be formed on the pattern layer 102 in the main pattern region as well as the dummy pattern region A. The first photoresist patterns 108 may serve as an etching mask to form at least portions of preliminary main patterns 110 and preliminary dummy patterns 112 (see FIGS. 6A and 6B).

Figure 6A:
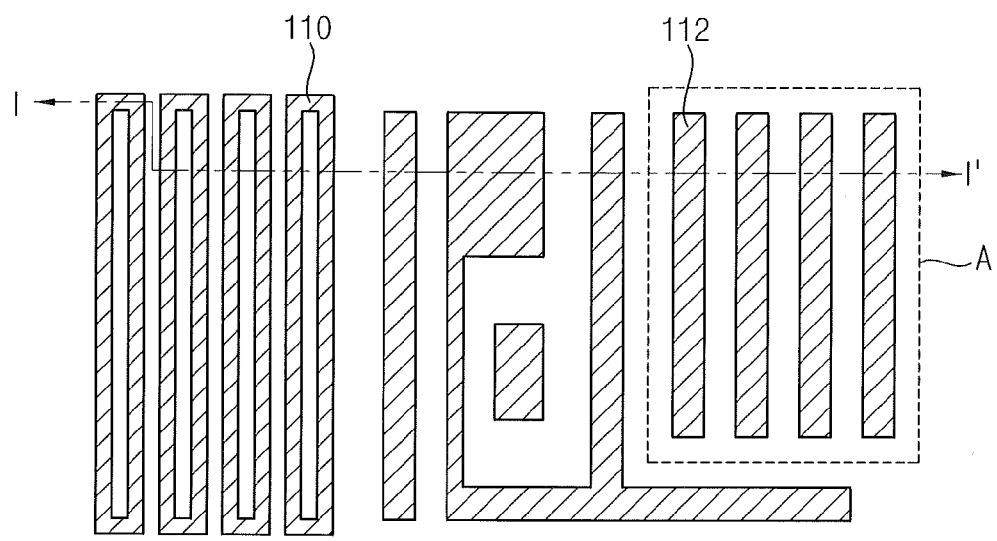
Figure 6B:
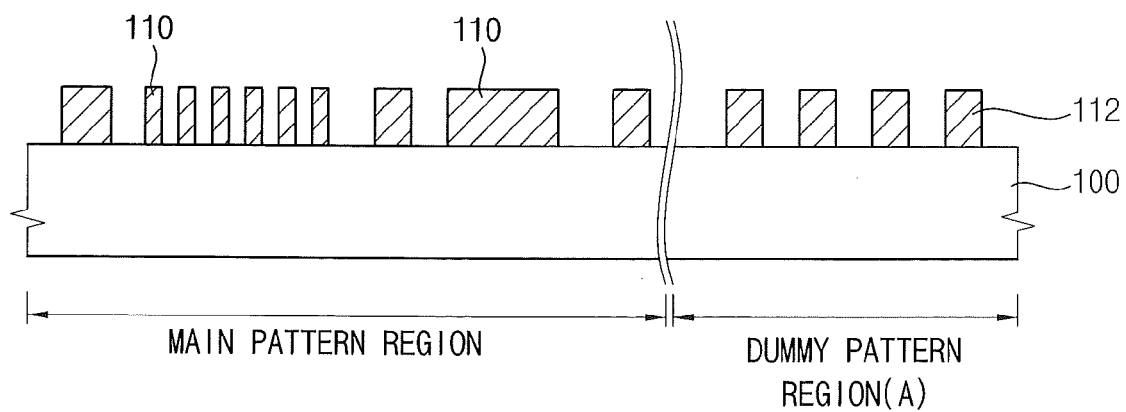

Referring to FIGS. 6A and 6B, the pattern layer 102 may be etched using the spacers 106 and the first photoresist patterns 108 as etching masks to form the preliminary main patterns 110 and the preliminary dummy patterns 112. The spacers 106 and the first photoresist patterns 108 may be removed.

By performing a double patterning process including a process for forming the spacers 106 and a process for forming the preliminary main patterns 110 using the spacers 106 as an etching mask, first main patterns 110a (see FIGS. 7A and 7B) may have a width smaller than the smallest width thereof that may be realized by a photolithography process. Additionally, the first main patterns 110a may have various shapes according to those of the spacers 106 serving as the etching mask.

In example embodiments according to the inventive concept, each of the preliminary dummy patterns 112 may be foamed to be in the shape of a line and to extend in the first direction, and the preliminary dummy patterns 112 may be formed to be spaced apart from each other by a particular amount in the second direction.

When a total area of the preliminary dummy patterns 112 is less than about 45% of a total area of the dummy pattern region A, an etching process or a polishing process using the preliminary dummy patterns 112 as an etching mask or a polish stop layer may not be controlled easily. Thus, the total area of the preliminary dummy patterns 112 may be equal to or more than about 45% of the total area of the dummy pattern region A subjected to polishing.

Figure 7A:
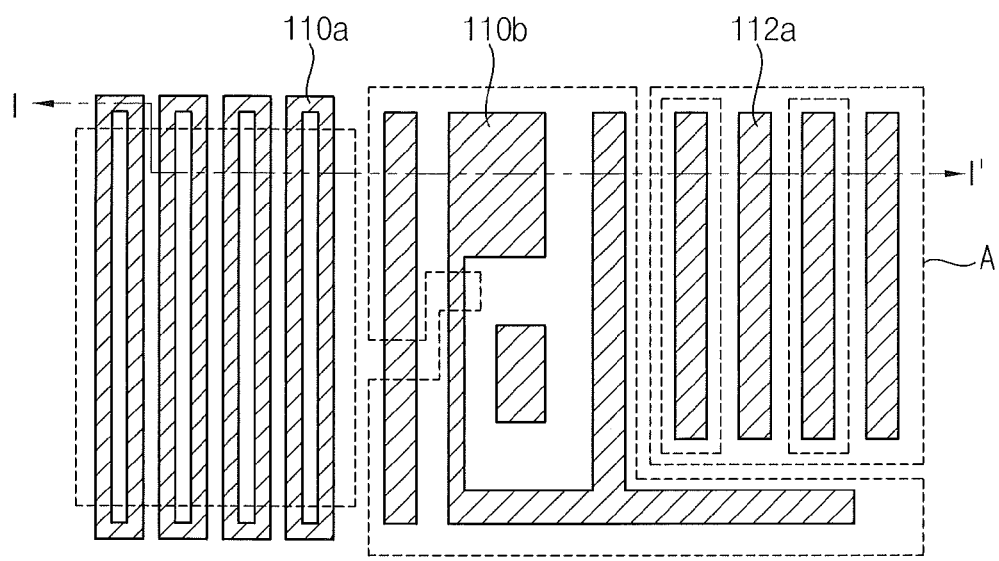
Figure 7B:
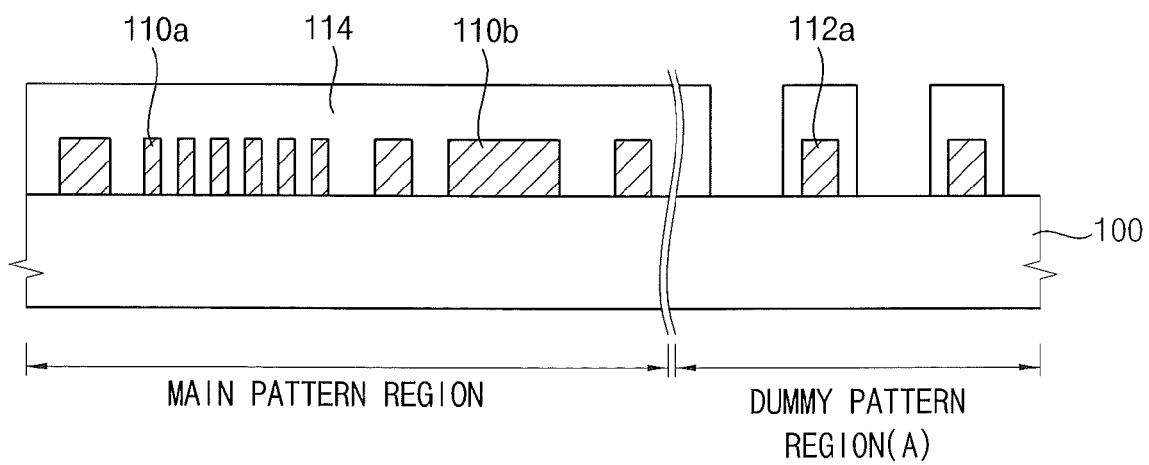

Referring to FIGS. 7A and 7B, a second photoresist film may be formed on the substrate 100 to cover the preliminary main patterns 110 and the preliminary dummy patterns 112. The second photoresist film may be patterned by a photolithography process to form second photoresist patterns 114 exposing portions of the preliminary main patterns 110 and the preliminary dummy patterns 112. The exposed portion of the preliminary main patterns 110 may be a specific undesired portion that may be preferably removed, however, the exposed portion of the preliminary dummy patterns 112 may be a random portion having a given area.

The exposed portions of the preliminary main patterns 110 and the preliminary dummy patterns 112 may be etched using the second photoresist patterns 114 as an etching mask to form the first main patterns 110a, second main patterns 110b and dummy patterns 112a. The first main patterns 110a have been formed by a double patterning process, and the second main patterns 110b have been formed by a photolithography process.

In FIGS. 7A and 7B, some of the preliminary dummy patterns 112 may be removed by the photolithography process, and thus the number of the dummy patterns 112a may be less than that of the preliminary dummy patterns 112. Additionally, the distance between the dummy patterns 112a may be greater than that of the preliminary dummy patterns 112. Alternatively, some portions of each preliminary dummy patterns 112 may be removed by the photolithography process, and thus the number of the dummy patterns 112a may be less than that of the preliminary dummy patterns 112.

The undesired portion of the preliminary main patterns 110 may have a very small line width because the preliminary main patterns 110 may have a very small line width by the double patterning process. Thus, when the undesired portion of the preliminary main patterns 110 are etched, detecting an etching end point may not be easy. Therefore, an etching process for removing the undesired portion of the preliminary main patterns 110 may not be controlled easily.

However, as described herein, the exposed portions of the preliminary dummy patterns 112 formed above may be etched along with the preliminary main patterns 110. Adding the area of the preliminary dummy patterns 112 increases the total area that is subjected to the etching, thereby increasing the amount that is removed by the etching. That is, by adding the exposed portion of the preliminary dummy patterns 112 to that being etched, the total area of the portions to be removed in the etching process is increased, and thus detecting the etching end point may be easier. As a result, the preliminary main patterns 110 may be etched to a desired thickness despite the fact that the size of the preliminary main patterns 110 is relatively small.

In example embodiments according to the inventive concept, a portion of the preliminary dummy patterns 112 corresponding to an area of at least about 15% of the total area of the dummy pattern region A may be exposed by the second photoresist patterns 114 and removed in the etching process.

However, the area of the removed portion of the preliminary dummy patterns 112 may not be limited thereto.

In example embodiments according to the inventive concept, the dummy patterns 112a may be formed to have an area of about 30 to 85% of the total area of the dummy pattern region A subjected to etching or polishing. If the dummy patterns 112a provide an area less than about 30% of the total area of the dummy pattern region A, the dummy patterns 112a may not serve as an adequate polishing end point in a planarization process of an upper portion of an insulating interlayer 108 (see FIG. 1B), and dishing may occur in the insulating interlayer 108. Additionally, the dummy pattern 112a may be formed by removing the exposed portion of the preliminary dummy pattern 112, which may have at least 15% of the total area of the dummy pattern region A, so that the dummy pattern 112a may have an area smaller than about 85% of the total area of the dummy pattern region A. In consideration of both the etching process and the planarization process, the dummy pattern 112a may have an area of about 45 to about 85% of the total area of the dummy pattern region A.

Referring to FIGS. 1A and 1B again, after removing the second photoresist films 114, the insulating interlayer 118 may be formed on the substrate 100 to fill gaps between the first and second main patterns 110a and 110b and the dummy patterns 112a. The upper portion of the insulating interlayer 118 may be planarized, e.g., by a CMP process until top surfaces of the first and second main patterns 110a and 110b and the dummy patterns 112a are exposed. The top surface of the dummy patterns 112a may serve as a polish stop layer. The insulating interlayer 118 may have a planar top surface because of the dummy patterns 112a.

Figure 8A:
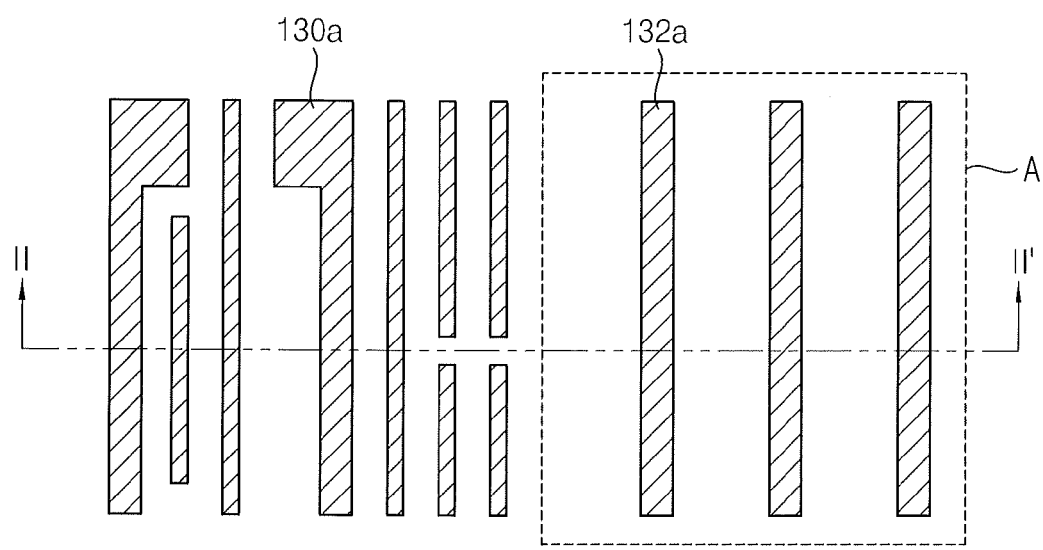
FIG. 8A is a top view illustrating a semiconductor device in accordance with other example embodiments according to the inventive concept.
Figure 8B:
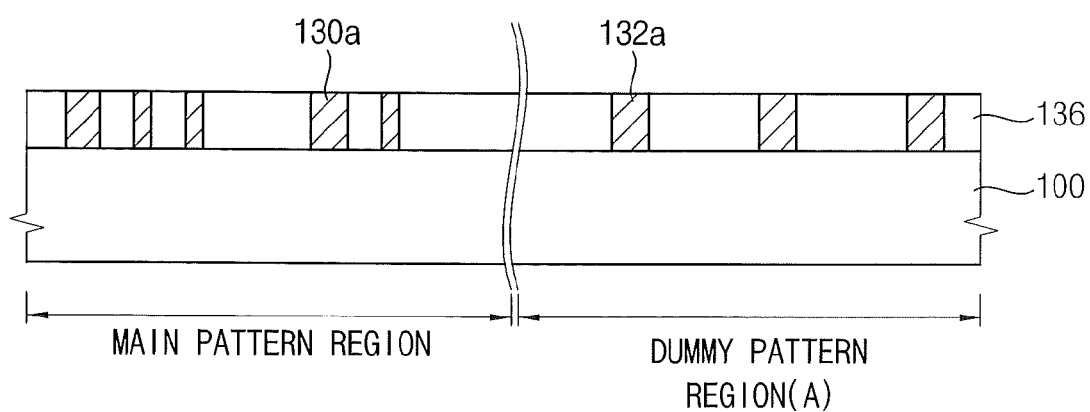
FIG. 8B is a cross-sectional view of the semiconductor device in FIG. 8A along the line II-II' according to the inventive concept.

FIG. 8A is a top view illustrating a semiconductor device in accordance with other example embodiments. FIG. 8B is a cross-sectional view of the semiconductor device in FIG. 8A along the line II-II'. The semiconductor device may be substantially the same as or similar to the semiconductor device of FIGS. 1A and 1B, except that the semiconductor device may not include first main patterns formed by a double patterning process. That is, main patterns of the semiconductor device may be formed only by a photolithography process.

Referring to FIGS. 8A and 8B, main patterns 130a may be formed on a substrate 100 in a main pattern region. The main patterns 130a may be used in the operation of the semiconductor device. Dummy patterns 132a may be formed on the substrate 100 in a dummy pattern region A. The dummy pattern 132a may have an area of about 30 to 85% of a total area of the dummy pattern region A.

In the present embodiment, the main patterns 130a may be formed by a photolithography process, and thus the main patterns 130a may have a line width substantially the same as or larger than the minimum line width of the photolithography process.

An insulating interlayer 136 surrounding sidewalls of the main patterns 130a and the dummy patterns 132a may be formed on the substrate 100. Top surfaces of the main patterns 130a, the dummy patterns 132a and the insulating interlayer 136 may be coplanar with each other.

Figure 9A:
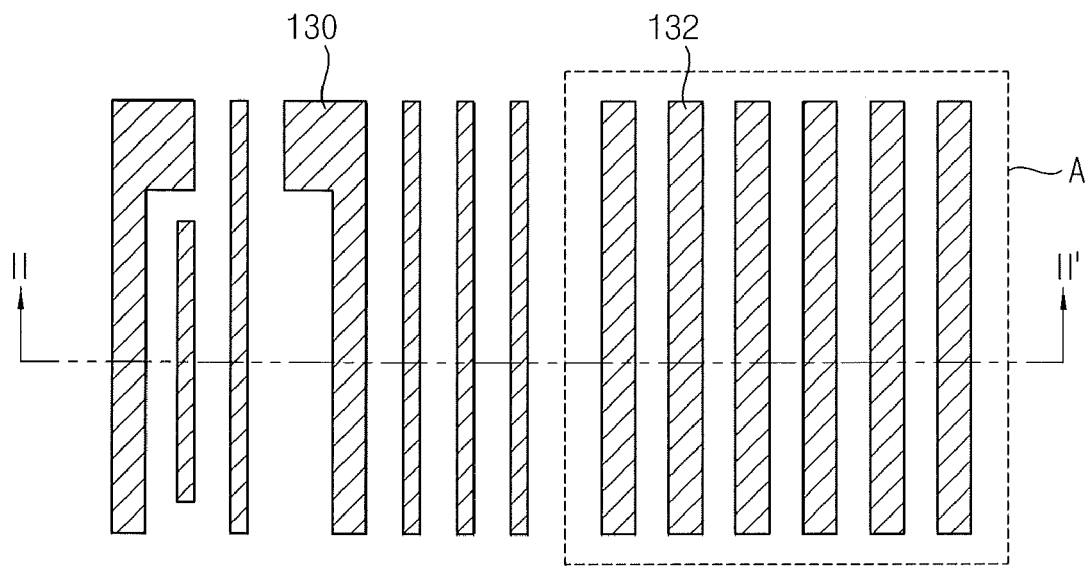
FIGS. 9A and 10A are top views illustrating a method of manufacturing the semiconductor device in FIGS. 8A and 8B according to the inventive concept.
Figure 9B:
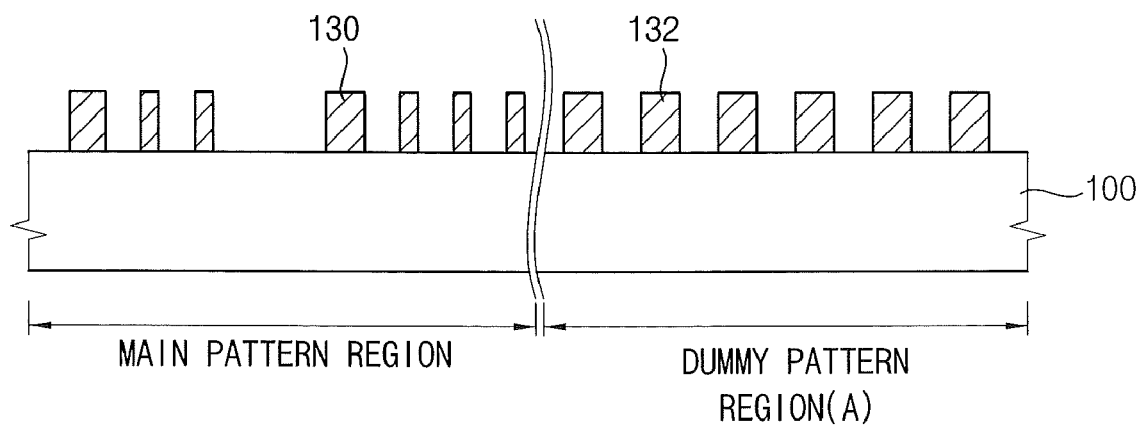
FIGS. 9B and 10B are cross-sectional views of the semiconductor device in FIGS. 9A and 10A, respectively, along the line II-II' according to the inventive concept.
Figure 10A:
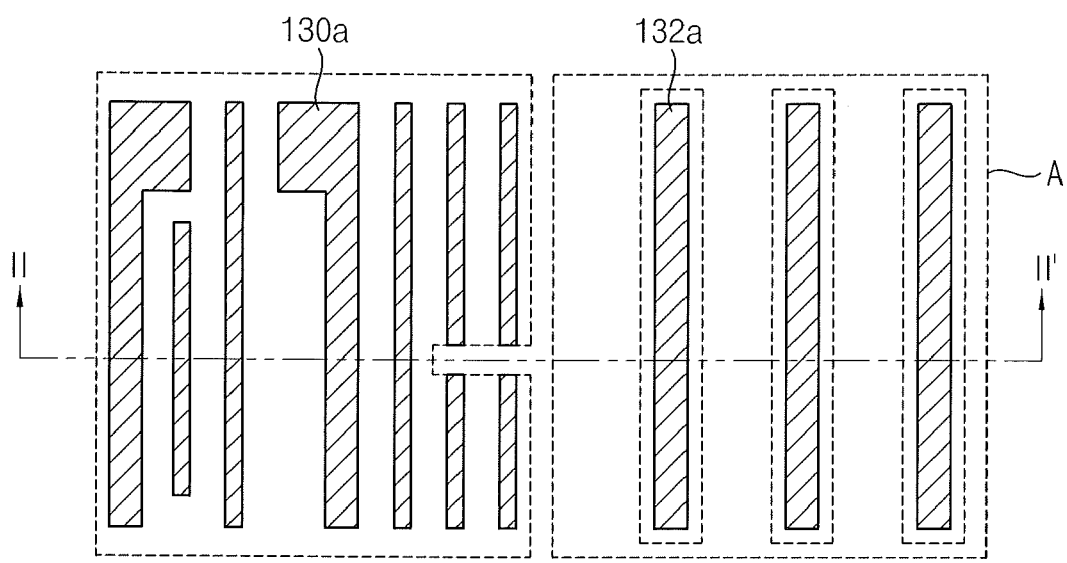
Figure 10B:
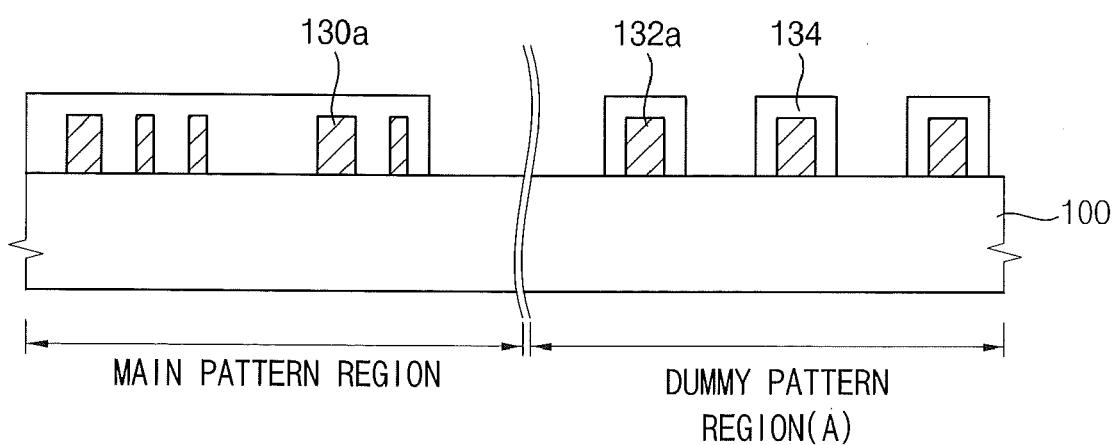

FIGS. 9A and 10A are top views illustrating a method of manufacturing the semiconductor device in FIGS. 8A and 8B. FIGS. 9B and 10B are cross-sectional views of the semiconductor device in FIGS. 9A and 10A, respectively, along the line II-II'.

Referring to FIGS. 9A to 9B, a pattern layer (not shown) may be formed on a substrate 100 that may be divided into a main pattern region and a dummy pattern region A. A first photoresist film may be formed on the pattern layer. The first photoresist film may be formed by a photolithography process to form first photoresist pattern (not shown). The first photoresist pattern may serve as an etching mask to form at least portions of preliminary main patterns 130 and preliminary dummy patterns 132.

Preliminary main patterns 130 and preliminary dummy patterns 132 may be formed by etching the pattern layer using the first photoresist pattern as an etching mask.

In example embodiment, the total area of the preliminary dummy pattern 132 may be equal to or more than about 30% of the total area of the dummy pattern area A.

Referring to FIGS. 10A and 10B, a second photoresist film may be formed on the substrate to cover the preliminary main patterns 130 and the preliminary dummy patterns 132. The second photoresist film may be patterned by a photolithography process to form second photoresist patterns 134 exposing portions of the preliminary main patterns 130 and the preliminary dummy patterns 132. The exposed portions of the preliminary main pattern 130 may be a specific undesired portion that may be preferably removed, however, the exposed portion of the preliminary dummy pattern 132 may be a random portion having a given area.

The exposed portions of the preliminary main patterns 130 and the preliminary dummy patterns 132 may be etched using the second photoresist patterns 134 as an etching mask to form main patterns 130a and dummy patterns 132a.

An area of the preliminary dummy patterns corresponding to about 15% of the total area of the dummy pattern region A may be removed, so that an etching end point of the etching process for forming the main patterns 130a may be detected easily. Thus, the area of the dummy patterns 132a may be at most about 85% of the total area of the dummy pattern region A. In consideration of the function of the dummy patterns 132a, i.e., the polish stop layer and the etching end point, the area of the dummy patterns 132a may be, preferably, about 30 to about 85% of the total area of the dummy pattern region A.

Referring to FIGS. 8A to 8B again, after removing the second photoresist films 134, an insulating interlayer 136 may be formed on the substrate 100 to fill gaps between the main patterns 130a and the dummy pattern 132a. The upper portions of the insulating interlayer 136 may be planarized, e.g., by a CMP process until top surfaces of the main patterns 130a and the dummy pattern 132a are exposed. The top surface of the dummy patterns 132a may serve as a polish stop layer. The insulating interlayer 136 may have a planar top surface because of the dummy patterns 132a.

Figure 11:
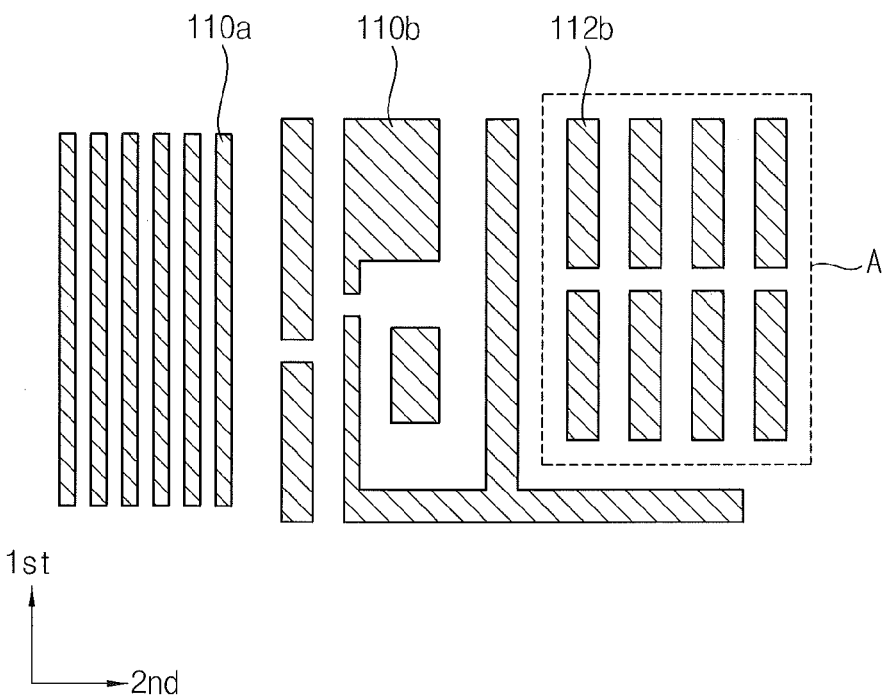

FIG. 11 is a top view illustrating a semiconductor device in accordance with other example embodiments. The semiconductor device may be substantially the same as or similar to the semiconductor device of FIGS. 1A and 1B, except for a shape of dummy patterns. Thus, detailed explanations about the semiconductor except for the shape of the dummy patterns are omitted here.

Referring to FIG. 11, first and second patterns 110a and 110b may be formed on a substrate 100 in a main pattern region and the dummy patterns 112a may be formed on the substrate 100 in a dummy pattern region A. Each of the dummy patterns 112a may extend in a first direction and may be spaced apart in a second direction perpendicular to the first direction. Each of the dummy patterns 112a may be cut in half in the first direction.

The dummy patterns 112a may have a length in the first direction smaller than the dummy patterns 112a of the semiconductor device in FIGS. 1A and 1B. In an example embodiment, the area of the dummy patterns 132a may be about 30 to about 85% of the total area of the dummy pattern region A. In the present embodiment, the first main pattern 110a may be formed by a double patterning process and the second main pattern 110b may be formed by a photolithography process. Alternatively, the first and second main patterns 110a and 110b may be formed only by a photolithography process.

Figure 12:
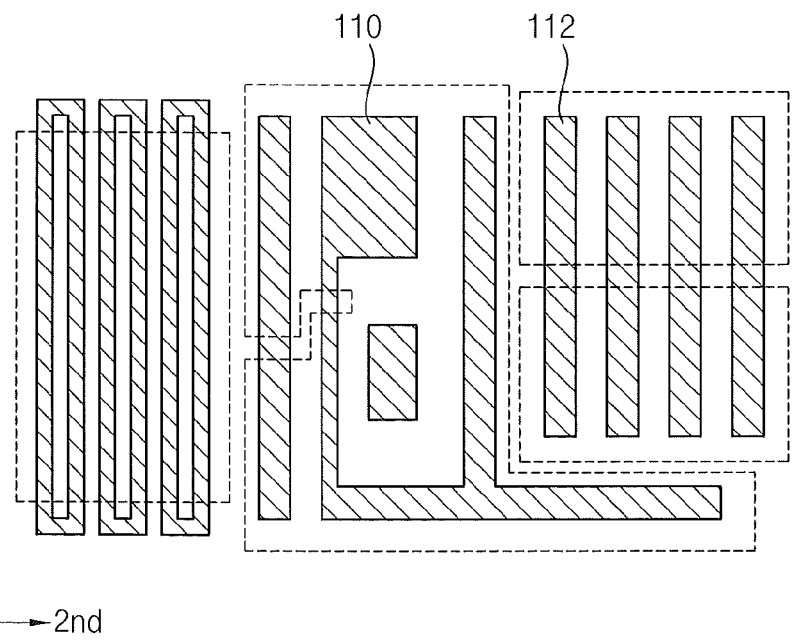

FIG. 12 is a top view illustrating a method of manufacturing the semiconductor device in FIG. 11. Processes for manufacturing the semiconductor device may be substantially the same as or similar to the processes illustrated with reference to FIGS. 2A to 7B, except for a shape of dummy patterns. Thus, detailed explanations about the semiconductor except for the shapes of the dummy patterns are omitted here.

Preliminary main patterns 110 and preliminary dummy patterns 112 (see FIG. 6B) may be formed on a substrate 100 in main pattern region and dummy pattern region A, respectively, by performing processes illustrated with reference to FIGS. 2A to 6B.

Referring to FIG. 12, a photoresist film may be formed on the substrate 100 to cover the preliminary main patterns 110 and the preliminary dummy patterns 112. The photoresist film may be patterned by a photolithography process to form second photoresist patterns exposing portions of the preliminary main patterns 110 and the preliminary dummy patterns 112. The exposed portion of the preliminary main patterns 110 may be a specific undesired portion that may be preferably removed, however, the exposed portion of the preliminary dummy patterns 112 may be a random portion having a given area.

The exposed portions of the preliminary main patterns 110 and the preliminary dummy patterns 112 may be etched using the second photoresist patterns as an etching mask to form first main patterns 110a, second main patterns 110b and dummy patterns 112a. The first main patterns 110a have been formed by a double patterning process, and the second main patterns 110b have been formed by a photolithography process.

In example embodiments, each of the preliminary dummy patterns 112 may be formed to have a linear shape extending in a first direction, and the preliminary dummy patterns 112 may be spaced apart from each other at a given distance in a second direction perpendicular to the first direction. Middle portions of each of the preliminary dummy patterns 112 may be exposed by the second photoresist patterns so that the middle portions of the preliminary dummy patterns 112 may be removed. In example embodiments, the dummy patterns 112a may be formed to have an area of about 30 to 85% of the total area of the dummy pattern region A.

After removing the second photoresist films, an insulating interlayer may be formed on the substrate 100 to fill gaps between the first and second main patterns 110a and 110b and the dummy patterns 112a. An upper portion of the insulating interlayer may be planarized, e.g., by a CMP process until top surfaces of the first and second main patterns 110a and 110b and the dummy patterns 112a are exposed. The top surface of the dummy patterns 112a may serve as a polish stop layer. The insulating interlayer may have a planar top surface because of the dummy patterns 112a.

Figure 13:
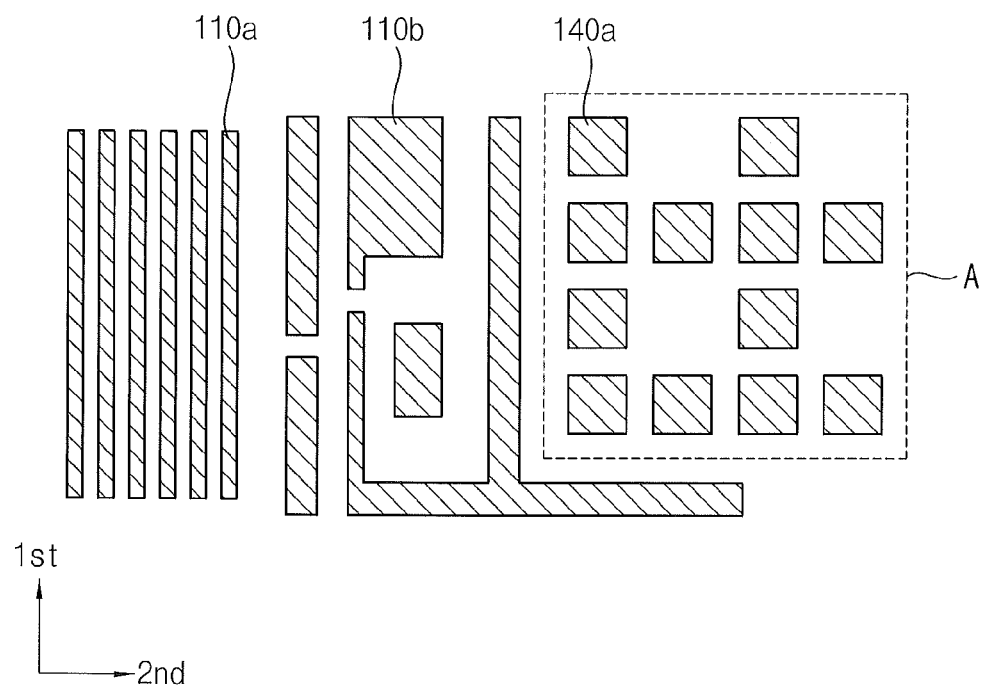

FIG. 13 is a top view illustrating a semiconductor device in accordance with other example embodiments. The semiconductor device may be substantially the same as or similar to the semiconductor device of FIGS. 1A and 1B, except for a shape of dummy patterns. Thus, detailed explanations about the semiconductor except for the shape of the dummy patterns are omitted here.

Referring to FIG. 13, first and second patterns 110a and 110b may be formed on a substrate 100 in a main pattern region and the dummy patterns 140a may be formed on the substrate 100 in a dummy pattern region A. Each of the dummy patterns 140a may have a rectangular shape. Each of the dummy patterns 140a may be spaced apart from each other in first and second directions, and at least one may be omitted therefrom. In an example embodiment, an area of the dummy patterns 132a may be about 30 to about 85% of a total area of the dummy pattern region A. In an example embodiment, the first main pattern 110a may be formed by a double patterning process and the second main pattern 110b may be formed by a photolithography process. Alternatively, the first and second main patterns 110a and 110b may be formed only by a photolithography process.

Figure 14:
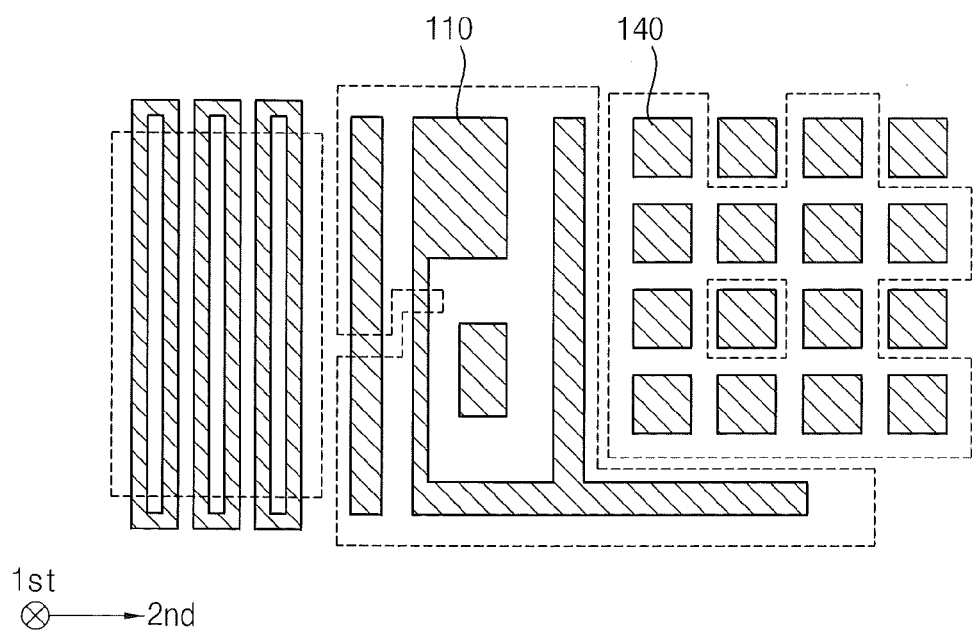

FIG. 14 is a top view illustrating a method of manufacturing the semiconductor device in FIG. 13. Processes for manufacturing the semiconductor device may be substantially the same as or similar to the processes illustrated with reference to FIGS. 2A to 7B, except for a shape of dummy patterns. Thus, detailed explanations about the semiconductor except for the shape of the dummy patterns are omitted here.

Spacers 106 and a pattern layer 102 (see FIG. 4B) may be formed on a substrate 100 divided into a main pattern region and a dummy pattern region A by performing processes illustrated with reference to FIGS. 2A to 4B.

Referring to FIG. 14, a first photoresist film may be formed on the pattern layer 102. The first photoresist film may be patterned by a photolithography process to form first photoresist patterns 108. The first photoresist patterns 108 may be formed on the pattern layer 102 in the main pattern region as well as the dummy pattern region A. The first photoresist patterns 108 may serve as an etching mask to form at least portions of preliminary main patterns 110 and preliminary dummy patterns 140.

The pattern layer 102 may be etched using the spacers 106 and the first photoresist patterns as etching masks to form the preliminary main patterns 110 and the preliminary dummy patterns 140. The spacers 106 and the first photoresist patterns may be removed.

By performing a double patterning process including a process for forming the spacers 106 and a process for forming the preliminary main patterns 110 using the spacers 106 as an etching mask, first main patterns 110a (see FIG. 13) may have a width smaller than the smallest width thereof that may be realized by a photolithography process.

In example embodiments, each of the preliminary dummy patterns 140 may be formed to have a rectangular shape being arranged regularly in first and second directions.

A second photoresist film may be formed on the substrate 100 to cover the preliminary main patterns 110 and the preliminary dummy patterns 140. The second photoresist film may be patterned by a photolithography process to form second photoresist patterns exposing portions of the preliminary main patterns 110 and the preliminary dummy patterns 140.

The exposed portions of the preliminary main patterns 110 and the preliminary dummy patterns 140 may be etched using the second photoresist patterns 114 as an etching mask to form the first main patterns 110a, second main patterns 110b and dummy patterns 140a. The first main patterns 110a have been formed by a double patterning process, and the second main patterns 110b have been formed by a photolithography process.

Referring to FIG. 13 again, at least one of the preliminary dummy patterns 140 may be removed by the photolithography process, and thus the number of the dummy patterns 140a may be smaller than that of the preliminary dummy patterns 140.

After removing the second photoresist films, an insulating interlayer may be formed on the substrate 100 to fill gaps between the first and second main patterns 110a and 110b and the dummy patterns 140a. An upper portion of the insulating interlayer may be planarized, e.g., by a CMP process until top surfaces of the first and second main patterns 110a and 110b and the dummy patterns 140a are exposed. The top surface of the dummy patterns 140a may serve as a polish stop layer. The insulating interlayer may have a planar top surface because of the dummy patterns 140a.

Figure 15:
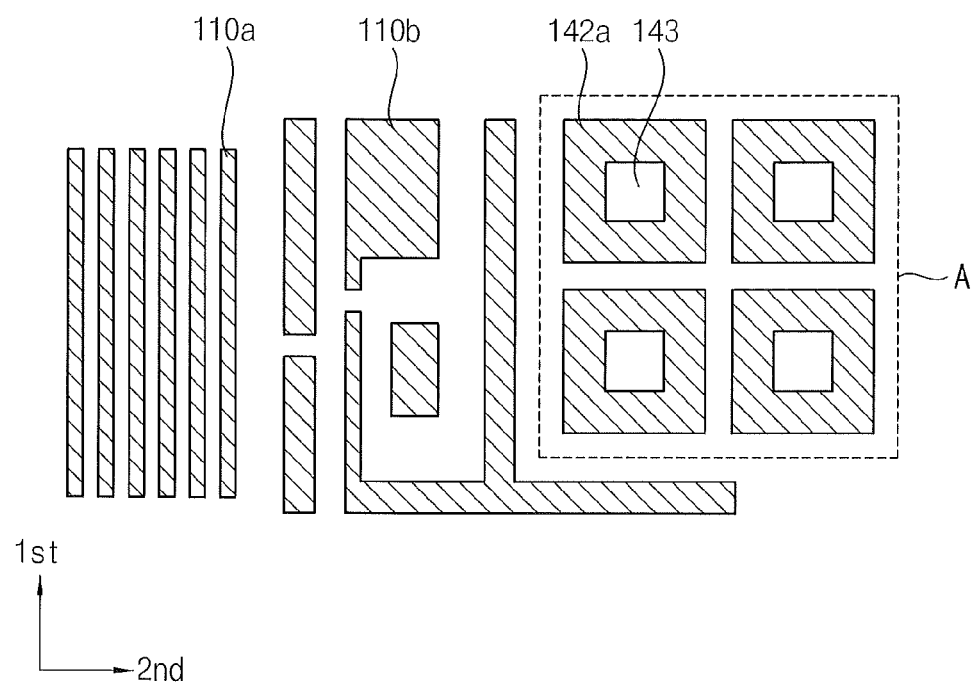

FIG. 15 is a top view illustrating a semiconductor device in accordance with other example embodiments. The semiconductor device may be substantially the same as or similar to the semiconductor device of FIGS. 1A and 1B, except for a shape of dummy patterns. Thus, detailed explanations about the semiconductor except for the shape of the dummy patterns are omitted here.

Referring to FIG. 15, first and second patterns 110a and 110b may be formed on a substrate 100 in a main pattern region and the dummy patterns 142a may be formed on the substrate 100 in a dummy pattern region A. Each of the dummy patterns 142a may have a rectangular shape having holes 143 therein. Each of the dummy patterns 142a may be spaced apart from each other in first and second directions.

Figure 16:
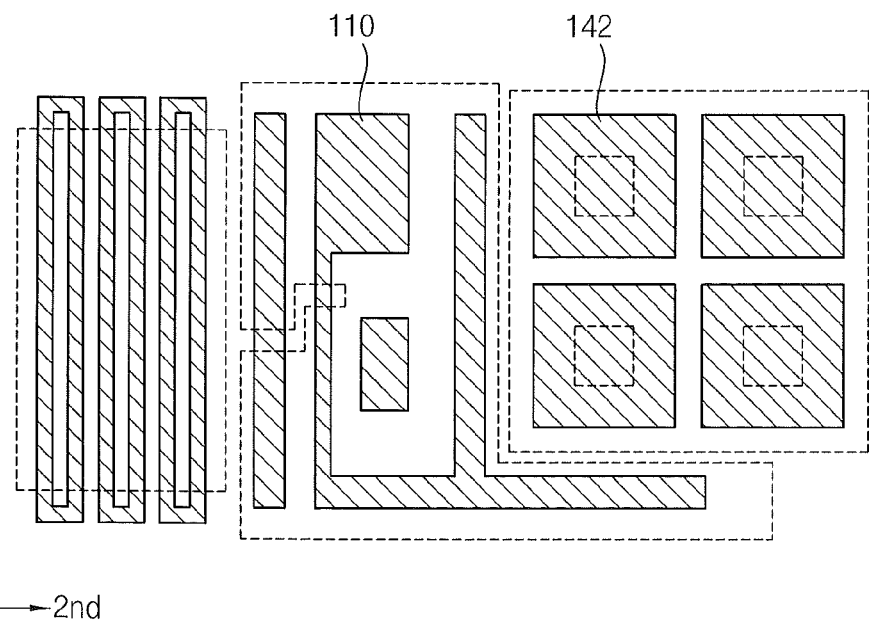

FIG. 16 is a top view illustrating a method of manufacturing the semiconductor device in FIG. 15. Processes for manufacturing the semiconductor device may be substantially the same as or similar to the processes illustrated with reference to FIGS. 2A to 7B, except for a shape of dummy patterns. Thus, detailed explanations about the semiconductor except for the shape of the dummy patterns are omitted here.

Spacers 106 and a pattern layer 102 (see FIG. 4B) may be formed on a substrate 100 divided into a main pattern region and a dummy pattern region A by performing processes illustrated with reference to FIGS. 2A to 4B.

Referring to FIG. 16, a first photoresist film may be formed on the pattern layer 102. The first photoresist film may be patterned by a photolithography process to form first photoresist patterns. The first photoresist patterns may be formed on the pattern layer 102 in the main pattern region as well as the dummy pattern region A. The first photoresist patterns may serve as an etching mask to form at least portions of preliminary main patterns 110 and preliminary dummy patterns 142.

The pattern layer 102 may be etched using the spacers 106 and the first photoresist patterns as etching masks to form the preliminary main patterns 110 and the preliminary dummy patterns 142. The spacers 106 and the first photoresist patterns may be removed.

By performing a double patterning process including a process for forming the spacers 106 and a process for forming the preliminary main patterns 110 using the spacers 106 as an etching mask, first main patterns 110a (see FIG. 15) may have a width smaller than the smallest width thereof that may be realized by a photolithography process. The preliminary dummy patterns 142 may be formed to have a rectangular shape spaced apart from each other at a given distance in first and second directions.

A second photoresist film may be formed on the substrate 100 to cover the preliminary main patterns 110 and the preliminary dummy patterns 140. The second photoresist film may be patterned by a photolithography process to form second photoresist patterns exposing portions of the preliminary main patterns 110 and the preliminary dummy patterns 140.

The exposed portions of the preliminary main patterns 110 and the preliminary dummy patterns 140 may be etched using the second photoresist patterns 114 as an etching mask to form the first main patterns 110a, second main patterns 110b and dummy patterns 140a. The first main patterns 110a have been formed by a double patterning process, and the second main patterns 110b have been formed by a photolithography process. Central portions of each preliminary dummy pattern 142 may be removed to form the holes 143 of the dummy patterns 142a.

After removing the second photoresist films, an insulating interlayer may be formed on the substrate 100 to fill gaps between the first and second main patterns 110a and 110b and the dummy patterns 142a. An upper portion of the insulating interlayer may be planarized, e.g., by a CMP process until top surfaces of the first and second main patterns 110a and 110b and the dummy patterns 142a are exposed. The top surface of the dummy patterns 142a may serve as a polish stop layer. The insulating interlayer may have a planar top surface because of the dummy patterns 142a.

Figure 17:
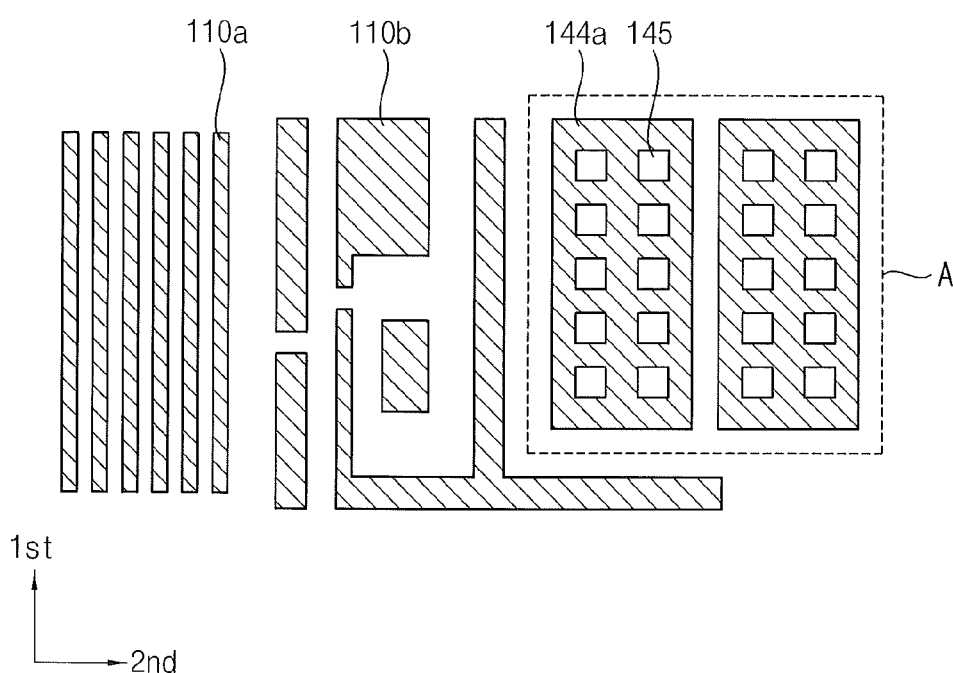

FIG. 17 is a top view illustrating a semiconductor device in accordance with other example embodiments. The semiconductor device may be substantially the same as or similar to the semiconductor device of FIGS. 1A and 1B, except for a shape of dummy patterns. Thus, detailed explanations about the semiconductor except for the shape of the dummy patterns are omitted here.

Referring to FIG. 17, first and second patterns 110a and 110b may be formed on a substrate 100 in a main pattern region and the dummy patterns 144a may be formed on the substrate 100 in a dummy pattern region A. Each of the dummy patterns 144a may have a linear shape extending in a first direction, and the dummy patterns 144a may be spaced apart from each other in a second direction perpendicular to the first direction. In example embodiments, each of the dummy patterns 144a may have a plurality of holes 145 therein. The dummy patterns 144a may have a width larger than those of the main patterns 110a and 110b.

Figure 18:
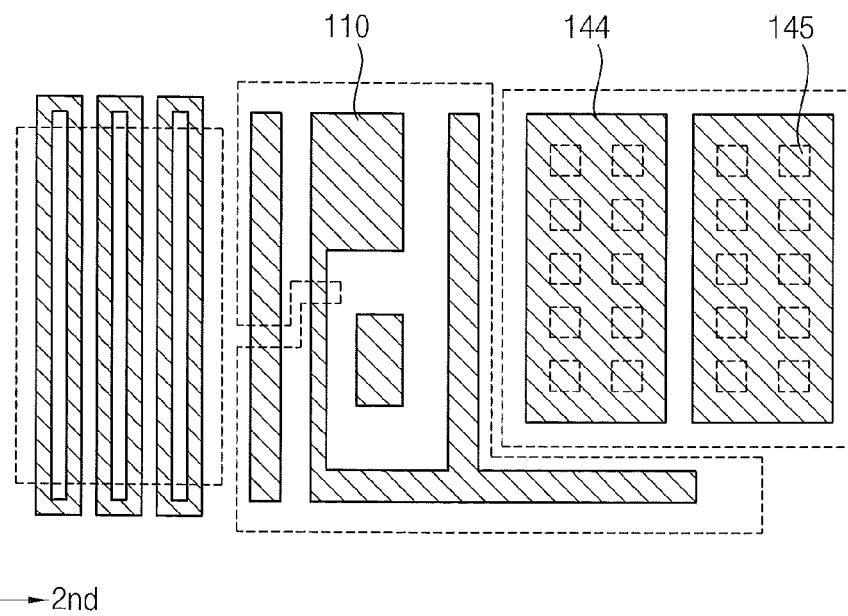

FIG. 18 is a top view illustrating a method of manufacturing the semiconductor device in FIG. 17. Processes for manufacturing the semiconductor device may be substantially the same as or similar to the processes illustrated with reference to FIGS. 2A to 7B, except for a shape of dummy patterns. Thus, detailed explanations about the semiconductor except for the shape of the dummy patterns are omitted here.

Spacers 106 and a pattern layer 102 (see FIG. 4B) may be formed on a substrate 100 divided into a main pattern region and a dummy pattern region A by performing processes illustrated with reference to FIGS. 2A to 4B.

Referring to FIG. 18, a first photoresist film may be formed on the pattern layer 102. The first photoresist film may be patterned by a photolithography process to form first photoresist patterns. The first photoresist patterns may be formed on the pattern layer 102 in the main pattern region as well as the dummy pattern region A. The first photoresist patterns may serve as an etching mask to form at least portions of preliminary main patterns 110 and preliminary dummy patterns 144.

The pattern layer 102 may be etched using the spacers 106 and the first photoresist patterns as etching masks to form the preliminary main patterns 110 and the preliminary dummy patterns 144. The spacers 106 and the first photoresist patterns may be removed.

By performing a double patterning process including a process for forming the spacers 106 and a process for forming the preliminary main patterns 110 using the spacers 106 as an etching mask, first main patterns 110a (see FIG. 17) may have a width smaller than the smallest width thereof that may be realized by a photolithography process. The preliminary dummy patterns 144 may be formed to have a rectangular shape spaced apart from each other at a given distance in first and second directions.

A second photoresist film may be formed on the substrate 100 to cover the preliminary main patterns 110 and the preliminary dummy patterns 144. The second photoresist film may be patterned by a photolithography process to form second photoresist patterns exposing portions of the preliminary main patterns 110 and the preliminary dummy patterns 144.

The exposed portions of the preliminary main patterns 110 and the preliminary dummy patterns 144 may be etched using the second photoresist patterns 114 as an etching mask to form the first main patterns 110a, second main patterns 110b and dummy patterns 144a. The first main patterns 110a have been formed by a double patterning process, and the second main patterns 110b have been formed by a photolithography process. Portions of the preliminary dummy patterns 144 may be removed to form a plurality of holes 145 of the dummy patterns 144a.

After removing the second photoresist films, an insulating interlayer may be formed on the substrate 100 to fill gaps between the first and second main patterns 110a and 110b and the dummy patterns 144a including in the holes 145. An upper portion of the insulating interlayer may be planarized, e.g., by a CMP process until top surfaces of the first and second main patterns 110a and 110b and the dummy patterns 144a are exposed. The top surface of the dummy patterns 144a may serve as a polish stop layer. The insulating interlayer may have a planar top surface because of the dummy patterns 144a.

Figure 19:
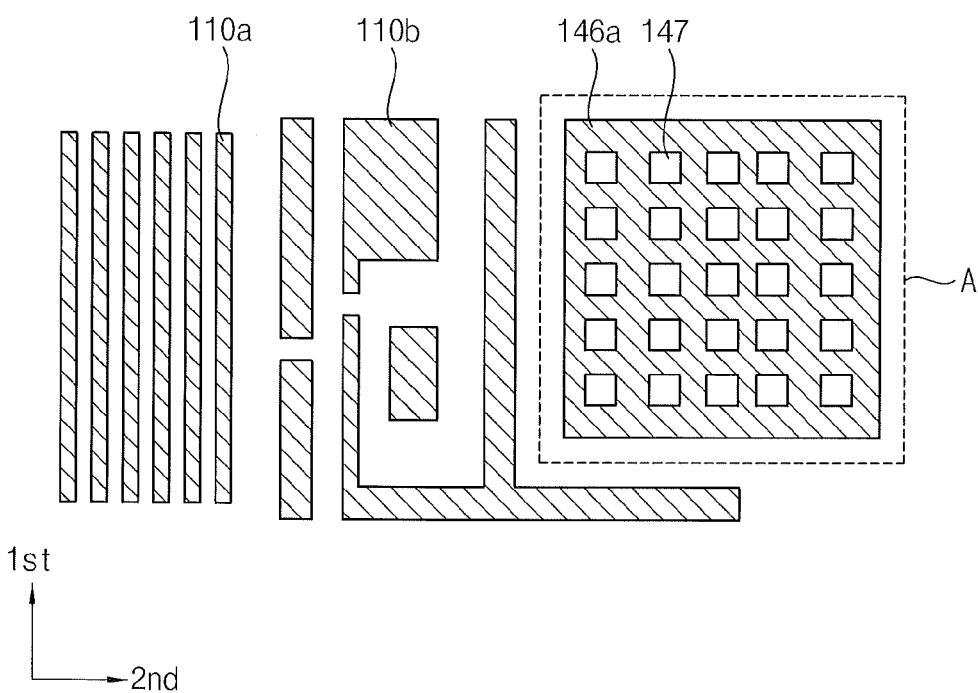

FIG. 19 is a top view illustrating a semiconductor device in accordance with other example embodiments. The semiconductor device may be substantially the same as or similar to the semiconductor device of FIGS. 1A and 1B, except for a shape of a dummy pattern. Thus, detailed explanations about the semiconductor except for the shape of the dummy patterns are omitted here.

Referring to FIG. 19, first and second patterns 110a and 110b may be formed on a substrate 100 in a main pattern region and the dummy pattern 146a may be formed on the substrate 100 in a dummy pattern region A. In example embodiments, the dummy pattern 146a may cover the dummy pattern region A and a total area of the dummy pattern 146a may be equal to or more than about 70% of a total area of the dummy pattern region A. In example embodiments, the dummy pattern 146a may have a plurality of holes 147 therein.

Figure 20:
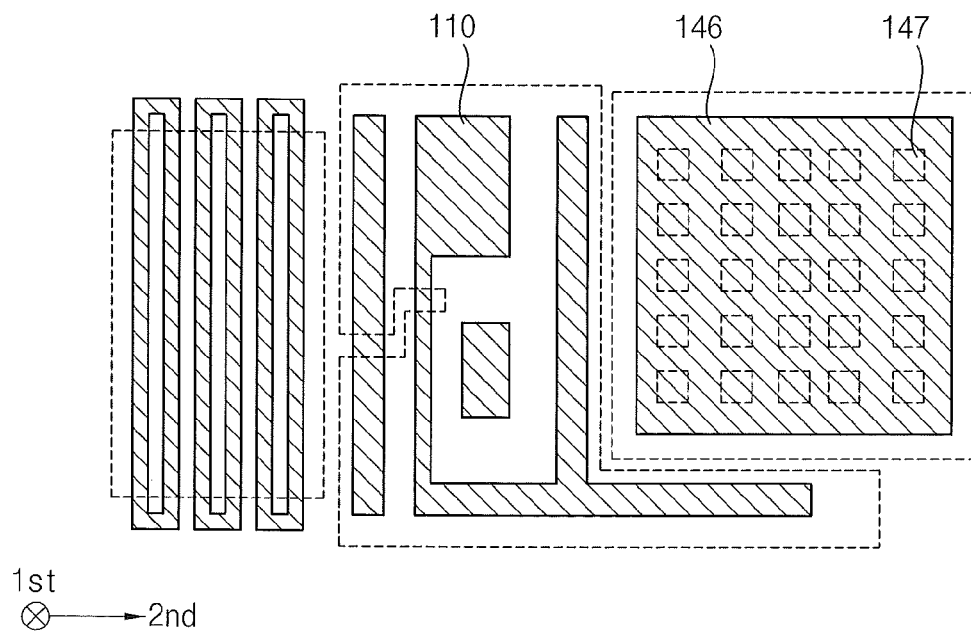

FIG. 20 is a top view illustrating a method of manufacturing the semiconductor device in FIG. 19. Processes for manufacturing the semiconductor device may be substantially the same as or similar to the processes illustrated with reference to FIGS. 2A to 7B, except for a shape of dummy patterns. Thus, detailed explanations about the semiconductor except for the shape of the dummy patterns are omitted here.

Spacers 106 and a pattern layer 102 (see FIG. 4B) may be formed on a substrate 100 divided into a main pattern region and a dummy pattern region A by performing processes illustrated with reference to FIGS. 2A to 4B.

Referring to FIG. 18, a first photoresist film may be formed on the pattern layer 102. The first photoresist film may be patterned by a photolithography process to form first photoresist patterns. The first photoresist patterns may be formed on the pattern layer 102 in the main pattern region as well as the dummy pattern region A. The first photoresist patterns may serve as an etching mask to foam at least portions of preliminary main patterns 110 and preliminary dummy patterns 146.

The pattern layer 102 may be etched using the spacers 106 and the first photoresist patterns as etching masks to form the preliminary main patterns 110 and the preliminary dummy patterns 146. The spacers 106 and the first photoresist patterns may be removed.

By performing a double patterning process including a process for forming the spacers 106 and a process for forming the preliminary main patterns 110 using the spacers 106 as an etching mask, first main patterns 110a (see FIG. 19) may have a width smaller than the smallest width thereof that may be realized by a photolithography process.

A second photoresist film may be formed on the substrate 100 to cover the preliminary main patterns 110 and the preliminary dummy patterns 146. The second photoresist film may be patterned by a photolithography process to form second photoresist patterns exposing portions of the preliminary main patterns 110 and the preliminary dummy patterns 146.

The exposed portions of the preliminary main patterns 110 and the preliminary dummy patterns 146 may be etched using the second photoresist patterns 114 as an etching mask to form the first main patterns 110a, second main patterns 110b and a dummy pattern 146a. The first main patterns 110a have been formed by a double patterning process, and the second main patterns 110b have been formed by a photolithography process. Portions of the preliminary dummy patterns 146 may be removed to form a plurality of holes 147 of the dummy pattern 146a.

After removing the second photoresist films, an insulating interlayer may be formed on the substrate 100 to fill gaps between the first and second main patterns 110a and 110b and the dummy pattern 146a and the holes 147. An upper portion of the insulating interlayer may be planarized, e.g., by a CMP process until top surfaces of the first and second main patterns 110a and 110b and the dummy pattern 146a are exposed. The top surface of the dummy pattern 146a may serve as a polish stop layer. The insulating interlayer may have a planar top surface because of the dummy pattern 146a.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
    forming a pattern layer on a substrate defined to include a main pattern region and a dummy pattern region;
    forming a preliminary main pattern and a preliminary dummy pattern by patterning the pattern layer so that an upper surface area of the preliminary dummy pattern facing away from a surface of the substrate is less than an entire area of the dummy pattern region that is be subjected to subsequent planarization; and partially etching the preliminary main pattern and the preliminary dummy pattern to simultaneously form a main pattern and a dummy pattern.

2. The method of claim 1, wherein forming a preliminary main pattern and a preliminary dummy pattern comprises:

forming the preliminary main pattern and the preliminary dummy pattern by patterning the pattern layer so that the upper surface area of the preliminary dummy pattern facing away from the surface of the substrate is less than the entire area of the dummy pattern region that is to be subjected to subsequent planarization and is about equal to or greater than 30% of the entire area of the dummy pattern region that is to be subjected to subsequent planarization.

3. The method of claim 2 further comprises:

forming the preliminary main pattern and the preliminary dummy pattern by patterning the pattern layer so that the upper surface area of the preliminary dummy pattern facing away from the surface of the substrate is about equal to or less than 85% of the entire area of the dummy pattern region that is to be subjected to subsequent planarization.

4. The method of claim 2 wherein forming a preliminary main pattern and a preliminary dummy pattern comprises:

forming the preliminary main pattern and the preliminary dummy pattern by patterning the pattern layer so that the upper surface area of the preliminary dummy pattern facing away from the surface of the substrate is less than the entire area of the dummy pattern region that is to be subjected to subsequent planarization and is about equal to or greater than 45% of the entire area of the dummy pattern region that is to be subjected to subsequent planarization.

5. The method of claim 1, wherein forming the preliminary main pattern and the preliminary dummy pattern includes:

forming a sacrificial layer pattern on the pattern layer;

forming a spacer on a side wall of the sacrificial layer pattern;

removing the sacrificial layer pattern so that the spacer remains; and partially etching the pattern layer using the spacer as an etching mask to form a portion of the preliminary main pattern having a width that is less than a width of the sacrificial layer pattern having been removed.

6. The method of claim 5, wherein forming the preliminary main pattern and the preliminary dummy pattern includes:

forming a photoresist pattern on the pattern layer; and partially etching the pattern layer using the photoresist pattern as an etching mask to form a remaining portion of the preliminary main pattern and the preliminary dummy pattern.

7. The method of claim 1, wherein partially etching the preliminary main pattern and the preliminary dummy pattern includes:

forming a photoresist pattern on the substrate, the photoresist pattern exposing portions of the preliminary main pattern and the preliminary dummy pattern; and partially etching the preliminary main pattern and the preliminary dummy pattern using the photoresist pattern as an etching mask.

8. The method of claim 1, wherein the upper surface area is about equal to or greater than 45% of a total area of the dummy pattern region that is to be subjected to subsequent planarization.

9. The method of claim 8, wherein partially etching the preliminary dummy pattern includes etching a portion of the preliminary dummy pattern having an area corresponding to about 15% of the total area of the dummy pattern region.

10. The method of claim 1, wherein forming the preliminary main pattern and the preliminary dummy pattern includes forming a plurality of the preliminary dummy patterns, and partially etching the preliminary dummy pattern includes removing at least one of the plurality of the preliminary dummy patterns.

11. The method of claim 1, wherein partially etching the preliminary dummy pattern includes forming the dummy pattern having at least one hole therein.

12. The method of claim 1, wherein partially etching the preliminary dummy pattern includes dividing the preliminary dummy pattern into a plurality of pieces.

13. The method of claim 1, further comprising:

forming an insulating interlayer on the substrate to cover the main pattern and the dummy pattern; and planarizing an upper portion of the insulating interlayer until a top surface of the main pattern and the upper surface of the dummy pattern are exposed.

14. The method of claim 13, wherein planarizing the upper portion of the insulating interlayer is performed by a chemical mechanical polishing (CMP) process.

15. The method of claim 13, wherein planarizing the upper portion of the insulating interlayer is performed using the dummy pattern as a polish stop layer.

16. A method of manufacturing a semiconductor device, comprising:

forming a pattern layer on a substrate that is divided into a main pattern region and a dummy pattern region;

forming a preliminary main pattern and a preliminary dummy pattern by patterning the pattern layer; and partially etching the preliminary main pattern and the preliminary dummy pattern to simultaneously form a main pattern and a dummy pattern.

* * * * *